US012575248B2

(12) United States Patent
Li et al.

(10) Patent No.: US 12,575,248 B2
(45) Date of Patent: Mar. 10, 2026

(54) ZINC OXIDE NANOMATERIAL AND PREPARATION METHOD THEREOF AND SEMICONDUCTOR DEVICE

(71) Applicant: TCL TECHNOLOGY GROUP CORPORATION, Huizhou (CN)

(72) Inventors: Junjie Li, Huizhou (CN); Tianshuo Zhang, Huizhou (CN); Yulin Guo, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 779 days.

(21) Appl. No.: 17/851,536

(22) Filed: Jun. 28, 2022

(65) Prior Publication Data

US 2022/0336764 A1 Oct. 20, 2022

Related U.S. Application Data

(63) Continuation of application No. PCT/CN2020/138797, filed on Dec. 24, 2020.

(30) Foreign Application Priority Data

Jun. 15, 2020 (CN) ......................... 202010543012.4

(51) Int. Cl.

| | |
|---|---|
| ***C01G 9/02*** | (2006.01) |
| ***B82Y 30/00*** | (2011.01) |
| ***C09K 11/02*** | (2006.01) |
| ***C09K 11/06*** | (2006.01) |
| ***H10K 30/15*** | (2023.01) |
| ***H10K 50/115*** | (2023.01) |
| ***H10K 50/15*** | (2023.01) |
| *H10K 30/50* | (2023.01) |
| *H10K 85/10* | (2023.01) |
| *H10K 85/20* | (2023.01) |
| *H10K 85/30* | (2023.01) |
| *H10K 102/00* | (2023.01) |

(52) U.S. Cl.

CPC ............ *H10K 30/152* (2023.02); *B82Y 30/00* (2013.01); *C09K 11/025* (2013.01); *C09K 11/06* (2013.01); *H10K 50/115* (2023.02); *H10K 50/15* (2023.02); *C09K 2211/188* (2013.01); *H10K 30/50* (2023.02); *H10K 85/115* (2023.02); *H10K 85/146* (2023.02); *H10K 85/151* (2023.02); *H10K 85/211* (2023.02); *H10K 85/381* (2023.02); *H10K 2102/00* (2023.02)

(58) Field of Classification Search

CPC .... H10K 50/115; H10K 50/15; H10K 85/151; H10K 85/146; H10K 85/115; H10K 85/211; H10K 85/381; B82Y 30/00; C09K 11/025; C09K 11/06; C09K 2211/188; C01G 9/02

See application file for complete search history.

(56) References Cited

U.S. PATENT DOCUMENTS 2,044,016 A * 6/1936 Perkins ................. C07C 233/00 564/124

FOREIGN PATENT DOCUMENTS

| | | | | |
|---|---|---|---|---|
| CN | 106634948 A | | 5/2017 | |
| CN | 109928903 A | | 6/2019 | |
| CN | 109935735 A | | 6/2019 | |
| CN | 109994620 A | | 7/2019 | |
| CN | 110739404 A | | 1/2020 | |
| CN | 112750954 A | * | 5/2021 | ............. H10K 50/11 |
| IN | 107983307 A | | 5/2018 | |
| KR | 101292695 B1 | | 8/2013 | |
| WO | WO-2020142480 A1 | * | 7/2020 | ............. H01L 33/06 |

OTHER PUBLICATIONS

Machine translation of CN112750954.*

World Intellectual Property Organization (WIPO) International Search Report for PCT/CN2020/138797 Mar. 24, 2021 4 Pages (Including Translation).

Piotr Krupiński et al: "Applying Mechanochemistry for Bottom-Up Synthesis and Host-Guest Surface Modification of Semiconducting Nanocrystals: A Case of Water-Soluble [beta]—Cyclodextrin-Coated Zinc Oxide", Chemistry—A European Journal,, vol. 22, No. 23, Apr. 26, 2016 (Apr. 26, 2016), pp. 7817-7823, XP093168353, ISSN: 0947-6539, DOI: 10.1002/ chem.201600182.

The European Patent Office (EPO) Extended Search Report for EP Application No. 20941172. 7 Jun. 7, 2024 6 Pages.

* cited by examiner

*Primary Examiner* — Haidung D Nguyen

(74) *Attorney, Agent, or Firm* — ANOVA LAW GROUP, PLLC

(57) ABSTRACT

A zinc oxide (ZnO) nanomaterial includes a ZnO nanoparticle and a surface ligand. The surface ligand bonded to the ZnO nanoparticle has a structure of

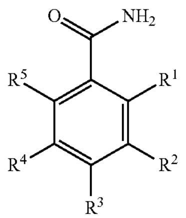

$R^1$, $R^2$, $R^3$, $R^4$, and $R^5$ are independently selected from at least one of hydrogen, alkoxy group with a carbon number of one to three, or amino group. $R^1$, $R^2$, $R^3$, $R^4$, and $R^5$ include one to three alkoxy groups with a carbon number of one to three and zero to one amino group.

16 Claims, 3 Drawing Sheets

ZINC OXIDE NANOMATERIAL AND PREPARATION METHOD THEREOF AND SEMICONDUCTOR DEVICE

CROSS-REFERENCE TO RELATED APPLICATIONS

This application is a continuation of International Application No. PCT/CN2020/138797, filed on Dec. 24, 2020, which claims priority to Chinese Application No. 202010543012.4 filed Jun. 15, 2020, the entire contents of both of which are incorporated herein by reference.

TECHNICAL FIELD

The present disclosure generally relates to the display technology field and, more particularly, to a zinc oxide (ZnO) nanomaterial, a preparation method of the ZnO nanomaterial, and a semiconductor device.

BACKGROUND

An electron transport layer material such as a zinc oxide (ZnO) based nanocrystal is widely studied to be used as a carrier transport material of a quantum dot light-emitting diode (QLED) device. In an application process of ZnO, since a particle diameter of a ZnO nanoparticle used for forming a nano ZnO electron transport layer is generally close to or even less than 5 nm, the ZnO nanoparticle has a very large specific surface area, which causes the ZnO particle to be very unstable to easily result in agglomeration. The agglomeration of ZnO particles has a great impact on film formation and electron transport performance. In order to reduce the agglomeration of the ZnO nanoparticles, surface ligands may be introduced on surfaces of the ZnO nanoparticles.

However, the surface ligands increase a transport distance of the electron in the nano ZnO electron transport layer after the film is formed, thereby hindering the transport of the electrons in the ZnO material. Thus, the conductivity of the nano ZnO electron transport layer may be affected. In addition, a surface defect of the ZnO as a nonradiative recombination center may generate an obvious quenching effect on excitons to greatly reduce the light-emitting efficiency of the quantum dot.

SUMMARY

One of the objectives of embodiments of the present disclosure is to provide a zinc oxide (ZnO) nanomaterial, a preparation method thereof, and a semiconductor device having the ZnO nanomaterial, and aims to solve the problem that the surface ligand of the ZnO nanoparticle increases the electronic transition distance of nano ZnO thin films to block the electrons transport of in the ZnO material.

Embodiments of the present disclosure provide a zinc oxide (ZnO) nanomaterial, including a ZnO nanoparticle and a surface ligand. The surface ligand bonded to the ZnO nanoparticle has a structure of

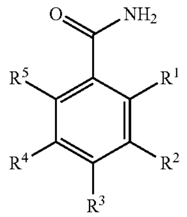

$R^1$, $R^2$, $R^3$, $R^4$, and $R^5$ are independently selected from at least one of hydrogen, alkoxy group with a carbon number of one to three, or amino group. $R^1$, $R^2$, $R^3$, $R^4$, and $R^5$ include one to three alkoxy groups with a carbon number of one to three and zero to one amino group.

Embodiments of the present disclosure provide a preparation method of a ZnO nanomaterial. The method includes preparing a mixed solution of a ZnO nanoparticle and a surface ligand and causing the ZnO nanoparticle to react with the surface ligand in the mixed solution to prepare ZnO nanoparticle having the surface ligand bonded thereto. The surface ligand has a structure of

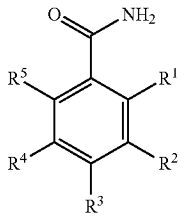

$R^1$, $R^2$, $R^3$, $R^4$, and $R^5$ are independently selected from at least one of hydrogen, alkoxy group with a carbon number of one to three, or amino group. $R^1$, $R^2$, $R^3$, $R^4$, and $R^5$ include one to three alkoxy groups with a carbon number of one to three and zero to one amino group.

Embodiments of the present disclosure provide a semiconductor device, including an anode, a cathode, an active layer, and an electron transport layer. The anode and the cathode are arranged oppositely to each other. The active layer is arranged between the anode and the cathode. The electron transport layer is arranged between the active layer and the cathode. A material of the electron transport layer includes a ZnO nanomaterial. The surface ligand has a structure of

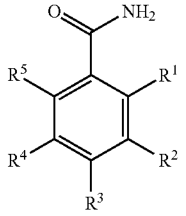

$R^1$, $R^2$, $R^3$, $R^4$, and $R^5$ are independently selected from at least one of hydrogen, alkoxy group with a carbon number of one to three, or amino group. $R^1$, $R^2$, $R^3$, $R^4$, and $R^5$ include one to three alkoxy groups with a carbon number of one to three and zero to one amino group. According to the semiconductor device of embodiments of this disclosure, the nanomaterial is used as the electron transport layer. Therefore, the obtained semiconductor device has good photoelectric efficiency and stability.

DETAILED DESCRIPTION OF THE EMBODIMENTS

Figure 1:
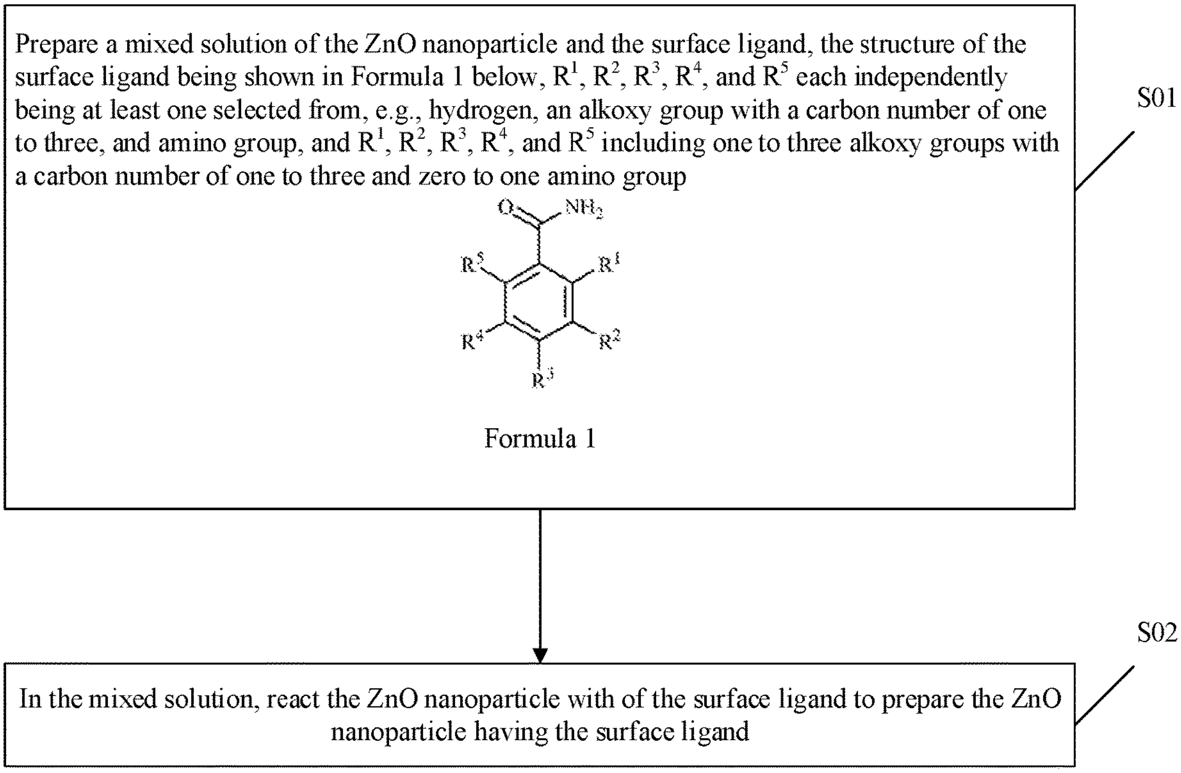
FIG. 1 is a schematic flowchart of preparing a zinc oxide nanomaterial according to some embodiments of the present disclosure.

In order to make the objectives, technical solutions, and advantages of the present disclosure clearer, the present disclosure is further described in detail below in connection with the accompanying drawings and embodiments. Embodiments described herein are only used to explain the present disclosure and are not intended to limit the present disclosure.

In some embodiments, the present disclosure provides a zinc oxide (ZnO) nanomaterial. The ZnO nanomaterial may include a ZnO nanoparticle and a surface ligand bonded to the ZnO nanoparticle. A structure of the surface ligand is shown in Formula 1 below.

Formula 1

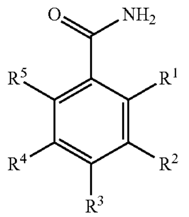

In Formula 1, $R^1$, $R^2$, $R^3$, $R^4$, and $R^5$ may each independently be at least one selected from, e.g., hydrogen, an alkoxy group with a carbon number of one to three, and amino group, and amino group. In some embodiments, $R^1$, $R^2$, $R^3$, $R^4$, and $R^5$ may include one to three alkoxy groups with a carbon number of one to three and zero to one amino group.

The ZnO nanomaterial of embodiments of the present disclosure may include the ZnO nanoparticle and the surface ligand of an alkoxyphenylamide structure shown in Formula 1 that is bonded to the ZnO nanoparticle. Since the ligand is absorbed on the surface of the ZnO nanoparticle, a distance between ZnO nanoparticles may be increased, and surface contact may be reduced to reduce the agglomeration. Based on this, in the surface ligand of the alkoxyphenylamide structure, an oxygen void bond in the alkoxy group may be combined with a suspended Zn bond in the ZnO nanoparticle to passivate the surface defect of the ZnO nanoparticle, reduce the quenching effect on the exciton by the surface defect of the ZnO as the nonradiative recombination center, and improve the recombination capability of the carriers. Further, the alkoxyphenylamide structure may have a conjugated $\pi$ bond, which may effectively improve transport ability of the carrier and the conductivity of the ZnO nanomaterial. In addition, by introducing the amino group to the surface ligand, the movement of the carrier may be enhanced, and the transport ability of the carrier may be improved, when the ZnO nanoparticle is used as the functional layer material of the semiconductor device. In summary, with the ZnO nanomaterial of embodiments of the present disclosure, the agglomeration may be reduced, and the conductivity may be improved.

In embodiments of the present disclosure, the alkoxy group with a carbon number of one to three may provide a bonding point for bonding the surface ligand with the ZnO nanoparticle. Further, using a phenylamide structure as the surface ligand may increase the electron transition distance between the ZnO nanoparticles. Since the benzamide in the alkoxyphenylamide structure has a conjugated $\pi$ bond, the transport ability of the ZnO nanoparticle on the carrier may be effectively improved, which can eliminate the impact on the conductivity of the ZnO nanomaterial due to the increase of the electron transition distance between the ZnO particles. Moreover, with the benzamide, the conductivity of the ZnO particle may be further enhanced.

In some embodiments, in Formula 1, $R^1$, $R^2$, $R^3$, $R^4$, and $R^5$ may include two alkoxy groups with a carbon number of one to three and zero to one amino group, and at least $R^2$ or $R^3$ may be alkoxy group with a carbon number of one to three. That is, two of $R^1$, $R^2$, $R^3$, $R^4$, and $R^5$ may be alkoxy group with a carbon number of one to three, and zero to one of $R^1$, $R^2$, $R^3$, $R^4$, and $R^5$ is amino group. Thus, a space steric hindrance of the alkoxyphenylamide structure may be small. With a benzamide conjugated structure, the conductivity of the ZnO nanoparticle may be improved. If too many of $R^1$, $R^2$, $R^3$, $R^4$, and $R^5$ are substituent groups, such as more than 3 (greater than 3), the effect of increasing the electron transition distance between the ZnO particles caused by a phenylamide structure may be obvious, and the effect of improving the conductivity of the ZnO nanoparticle through the conjugated $\pi$ bond of the benzamide may be reduced.

In some embodiments, the surface ligand may be at least one selected from, e.g., p-methoxybenzamide, m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,4-dimethoxybenzamide, 3,4-dimethoxybenzamide, or 5-amino-4-methoxybenzamide. The surface ligand may passivate the surface defect of the ZnO nanoparticle, and may also have an efficient carrier transport and injection ability.

Based on the above, in some embodiments, the ZnO nanomaterial may include the ZnO nanoparticle and the surface ligand bonded to the ZnO nanoparticle.

In some embodiments, in the ZnO nanomaterial, a molar ratio of the ZnO nanoparticle to the surface ligand bonded to the ZnO nanoparticle may range from 1:5 to 1:50. The molar ratio of the ZnO nanoparticle to the surface ligand bonded to the ZnO nanoparticle may be within the above range. The surface ligand may be fully combined with the reaction points on the ZnO nanoparticle to improve the surface defect of the ZnO nanoparticle and improve the electron transport performance of the ZnO nanoparticle. When the molar content of the surface ligand bonded to the ZnO nanoparticle is too high, for example, when the molar content of the ZnO nanoparticle is 1 and the molar content of the surface ligand exceeds 100, the combination of the surface ligand to the ZnO nanoparticle may not be strong enough, and hence the surface ligand may easily fall off, affecting the electron transport performance of the nanomaterial. When the molar content of the surface ligand bonded to the ZnO nanoparticle is too low, for example, when the molar content of the ZnO nanoparticle is 1 and the molar content of the surface ligand is less than 5, the surface ligand may have a limited effect on the ZnO nanoparticle electron transport layer, which is insufficient to achieve a significant improvement.

The nanomaterial of embodiments of the present disclosure may be prepared by the following method.

FIG. 1 shows a preparation method of a ZnO nanomaterial. The method includes the following processes.

At S01, a mixed solution of the ZnO nanoparticle and the surface ligand is prepared. The structure of the surface ligand is shown in Formula 1 below.

Formula 1

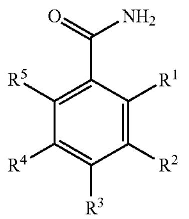

In Formula 1, $R^1$, $R^2$, $R^3$, $R^4$, and $R^5$ may each independently be at least one selected from, e.g., hydrogen, an alkoxy group with a carbon number of one to three, and amino group. In some embodiments, $R^1$, $R^2$, $R^3$, $R^4$, and $R^5$ may include one to three alkoxy groups with a carbon number of one to three and zero to one amino group.

At S02, in the mixed solution, the ZnO nanoparticle reacts with the surface ligand to prepare the ZnO nanoparticle having the surface ligand.

According to the preparation method of the ZnO nanomaterial of embodiments of the present disclosure, only the mixed solution of the ZnO nanoparticle and the surface ligand may need to be prepared. Through the reaction, the surface ligand may be bonded to the surface of the ZnO nanoparticle. The process of the method may be simple, and the condition of the method may be mild. The method may be easily used to realize large-scale production. Further, in the nanomaterial prepared by the method, the dispersity and conductivity of the ZnO nanomaterial may be improved.

In embodiments of the present disclosure, the ZnO nanoparticle and the surface ligand may be used as raw materials for preparing the ZnO nanomaterial. The structure of the surface ligand may be the one shown in Formula 1.

In some embodiments, in Formula 1, $R^1$, $R^2$, $R^3$, $R^4$, and $R^5$ may include two alkoxy groups with a carbon number of one to three and zero to one amino group, and at least $R^2$ or $R^3$ may be an alkoxy group with a carbon number of one to three. In some embodiments, the surface ligand may be at least one selected from, e.g., p-methoxybenzamide, m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,4-dimethoxybenzamide, 3,4-dimethoxybenzamide, or 5-amino-4-methoxybenzamide.

In some embodiments, the ZnO nanoparticle may be prepared by the method below. A preparation method of a ZnO nanoparticle includes:

- providing zinc salt and an alkali source, and dissolving the zinc salt in an organic solvent to prepare an organic solution of the zinc salt (S01);
- dissolving the alkali source in an organic solvent for mixing to prepare an alkali solution (S02); and
- adding the organic solution of the zinc salt to the alkali solution for mixing and reaction to prepare the ZnO nanoparticle (S03).

In some embodiments, in step S01, the zinc salt may be selected from an inorganic zinc salt and/or an organic zinc salt capable of ionizing to generate a zinc ion. In some embodiments, the zinc salt may be at least one selected from, but is not limited to, e.g., zinc acetate, zinc nitrate, zinc chloride, zinc sulfate, or zinc acetate dihydrate. The alkali source may be at least one selected from, e.g., inorganic alkali and/or organic alkali that can generate hydroxide ions in the mixed solution formed by adding the zinc salt organic solution into the alkali solution. The alkali source may include, but is not limited to, at least one of sodium hydroxide, potassium hydroxide, lithium hydroxide, or pentahydrate tetramethylammonium hydroxide.

In some embodiments, the zinc salt may be dissolved in the organic solvent. The organic solvent may be organic alcohol, including but not limited to at least one of isopropanol, ethanol, propanol, butanol, pentanol, or hexanol.

At S02, in some embodiments, the alkali source is dissolved in the organic solvent for mixing. The organic solvent may be organic alcohol, including but not limited to at least one of isopropanol, ethanol, propanol, butanol, pentanol, or hexanol. In some embodiments, the organic solvent for dissolving the alkali source may be the same as the organic solvent for dissolving the zinc salt.

At S03, the organic solution of the zinc salt is added to the alkali solution for mixing with a molar ratio of Zn ions to $OH^-$ being 1:(1-2). The alkali solution may react with the organic solution of the zinc salt to generate the ZnO nanoparticle. In some embodiments, the mixing process may adopt a stirring and mixing manner.

In embodiments of the present disclosure, preparing the mixed solution of the ZnO nanoparticle and the surface ligand may include preparing the organic solution of the ZnO particle first and then adding the surface ligand into the organic solution of the ZnO particle to form the mixed solution. In some other embodiments, the mixed solution may be formed by dispersing the ZnO particle and the surface ligand in the organic solution, or preparing the organic solution of the surface ligand first and then adding the ZnO particle to the organic solution of the surface ligand. In some embodiments, the mixed solution may be formed by first preparing the organic solution of the ZnO nanoparticle and then adding the surface ligand into the organic solution of the ZnO nanoparticle.

In some embodiments, the mixed solution of the ZnO nanoparticle and the surface ligand may be prepared. In the mixed solution, the molar ratio of the ZnO nanoparticle to the surface ligand may range from 1:5 to 1:50.

In some embodiments, during preparing the mixed solution of the ZnO nanoparticle and the surface ligand to react to prepare the ZnO nanoparticle having the surface ligand, the reaction temperature may range from 20° C. to 60° C.

Figure 2:
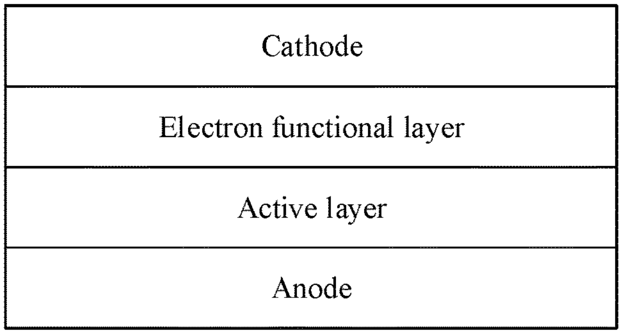
FIG. 2 is a schematic structural diagram of a semiconductor device according to some embodiments of the present disclosure.

FIG. 2 shows a semiconductor device consistent with the disclosure. The semiconductor device includes an anode, a cathode, an active layer, and an electron transport layer. The anode and the cathode are arranged oppositely to each other. The active layer is arranged between the anode and the cathode. The electron transport layer is arranged between the active layer and the cathode. A material of the electron transport layer may be the ZnO nanomaterial. The zinc oxide nanomaterial may include the ZnO nanoparticle and the surface ligand bonded to the ZnO nanoparticle. The structure of the surface ligand is shown in Formula 1 below.

Formula 1

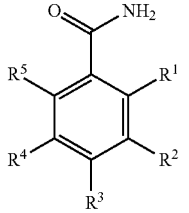

In Formula 1, $R^1$, $R^2$, $R^3$, $R^4$, and $R^5$ may each independently be at least one selected from, e.g., hydrogen, an alkoxy group with a carbon number of one to three, and amino group. In some embodiments, $R^1$, $R^2$, $R^3$, $R^4$, and $R^5$ may include one to three alkoxy groups with a carbon number of one to three and zero to one amino group.

In the semiconductor device of embodiments of the present disclosure, the above nanomaterial may be used as the electron transport layer. Therefore, the obtained semiconductor device may have good photoelectric efficiency and stability.

In embodiments of the present disclosure, the ZnO nanomaterial may include the ZnO nanoparticle and the surface ligand shown in Formula 1 bonded to the ZnO nanoparticle. In the surface ligand of Formula 1, the alkoxy group with a carbon number of one to three may provide the bonding point for bonding the surface ligand with the ZnO nanoparticle. Further, using the phenylamide structure as the surface ligand, which may increase the electron transition distance between the zinc oxide nanoparticles. Since the benzamide in the alkoxyphenylamide structure has the conjugated π bond, the transport ability of the ZnO nanoparticle on the carrier may be effectively improved, which can eliminate the impact on the conductivity of the ZnO nanomaterial due to the increase of the electron transition distance between the ZnO particles. Moreover, with the benzamide, the conductivity of the ZnO particle may be further enhanced.

In some embodiments, in Formula 1, $R^1$, $R^2$, $R^3$, $R^4$, and $R^5$ may include two alkoxy groups with a carbon number of one to three and zero to one amino group, and at least $R^2$ or $R^3$ may be the alkoxy group with a carbon number of one to three. That is, two of $R^1$, $R^2$, $R^3$, $R^4$, and $R^5$ may be the alkoxy group with a carbon number of one to three, and zero to one of $R^1$, $R^2$, $R^3$, $R^4$, and $R^5$ may be the amino group. Thus, a space steric hindrance of the alkoxyphenylamide structure may be small. With a benzamide conjugated structure, the conductivity of the ZnO nanoparticle may be improved. If too many of $R^1$, $R^2$, $R^3$, $R^4$, and $R^5$ are substituent groups, such as more than 3 (greater than 3), the effect of increasing the electron transition distance between the ZnO particles caused by phenylamide structure may be obvious, and the effect of improving the conductivity of the ZnO nanoparticle through the conjugated π bond of the benzamide may be reduced.

In some embodiments, the surface ligand may be at least one selected from, e.g., p-methoxybenzamide, m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,5-dimethoxybenzamide, 3,4-dimethoxybenzamide, or 5-amino-4-methoxybenzamide. The surface ligand may passivate the surface defect of the ZnO nanoparticle, and may also have the efficient carrier transport and injection ability.

Based on the above, in some embodiments, the ZnO nanomaterial may include the ZnO nanoparticle and the surface ligand bonded to the ZnO nanoparticle.

In some embodiments, in the ZnO nanomaterial, a molar ratio of the ZnO nanoparticle to the surface ligand bonded to the ZnO nanoparticle may range from 1:5 to 1:50. The molar ratio of the ZnO nanoparticle to the surface ligand bonded to the ZnO nanoparticle may be within the above range. The surface ligand may be fully combined with the reaction points on the ZnO nanoparticle to improve the surface defect of the ZnO nanoparticle and improve the electron transport performance of the ZnO nanoparticle. When the molar content of the surface ligand bonded to the ZnO nanoparticle is too high, for example, when the molar content of the ZnO nanoparticle is 1, and the molar content of the surface ligand exceeds 100, the combination of the surface ligand to the ZnO nanoparticle may not be strong enough, and hence the surface ligand may easily fall off, affecting the electron transport performance of the nanomaterial. When the molar content of the surface ligand bonded to the ZnO nanoparticle is too low, for example, when the molar content of the ZnO nanoparticles is 1, and the molar content of the surface ligand is less than 5, the surface ligand may have the limited effect on the ZnO nanoparticle electron transport layer, which is insufficient to achieve a significant improvement.

In embodiments of the present disclosure, the thickness of the electron transport layer may range from 70 to 90 nm.

In some embodiments, the semiconductor device may include a solar cell (a device absorbs light through the active layer, such as a perovskite solar cell) or a light-emitting device (the device emits light from a top electrode or a bottom electrode, and the active layer is a light-emitting layer). In some embodiments, the light-emitting device may include an organic light-emitting diode or a quantum dot light-emitting diode. The quantum dot light-emitting diode may include a perovskite light-emitting diode. In some embodiments, the active layer may include the quantum dot light-emitting layer. Correspondingly, the semiconductor device may include the quantum dot light-emitting diode.

Figure 3:
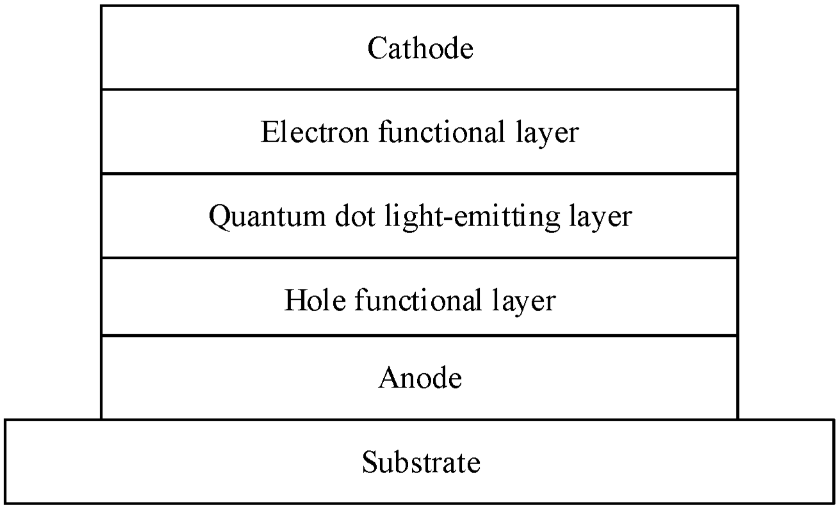
FIG. 3 is a schematic structural diagram of a forward structure of a quantum dot light-emitting diode (QLED) according to some embodiments of the present disclosure.
Figure 4:
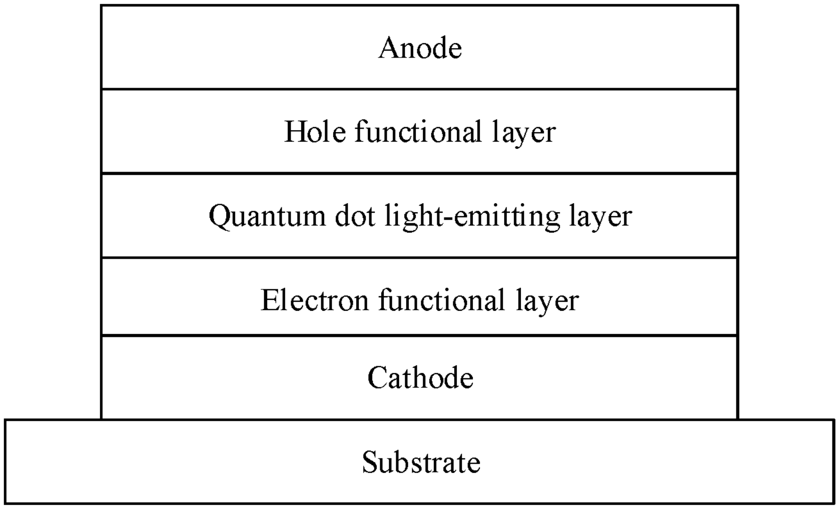
FIG. 4 is a schematic structural diagram of an inverted structure of a QLED according to some embodiments of the present disclosure.

The light-emitting device of embodiments of the present disclosure may be divided into a forward structure electroluminescent device and an inverted structure electroluminescent device. As shown in FIG. 3, the forward structure includes a substrate, an anode, a quantum dot light-emitting layer, an electron transport layer, and a cathode, optional hole functional layer(s), such as a hole injection layer, a hole transport layer, and/or an electron blocking layer, arranged between the anode and the quantum dot light-emitting layer, and an optional electron injection layer arranged between the electron transport layer and the cathode. As shown in FIG. 4, the inverted structure is the opposite of the forward structure.

When the light-emitting device is a QLED, the ZnO nanoparticle may be used as the electron transport layer of the QLED device. Thus, the amino group may be introduced on the surface ligand of the ZnO nanomaterial, which can enhance the coordination ability of the electron transport material and the ligand on the surface of the quantum dot. Thus, the movement of the carrier may be further enhanced, and the transport ability of the carrier may be improved.

In some embodiments, the selection of the anode may not be strictly limited. The anode may include a doped metal oxide, for example, an indium-doped tin oxide (ITO). A material of the hole transport layer may be selected from poly[(9,9-dioctylfluorenyl-2,7-diyl)-co-(4,4'-(N-(4-sec-butylphenyl)diphenylamine)] (TFB), polyvinylcarbazole (PVK), etc. A material of the quantum dot light-emitting layer may be selected from CdS, CdSe, etc. A material of the cathode may be selected from one or more of a conductive carbon material (e.g., C60), a conductive metal oxide material (e.g., ITO), and a metal material (e.g., Ag). In some embodiments, the light-emitting device may further include a packaging layer. The packaging layer may be arranged on a surface of the top electrode (the electrode away from the substrate) or a surface of the entire electroluminescent device.

The quantum dot light-emitting diode may be prepared by the following method. A preparation method of a quantum dot light-emitting diode includes the following processes.

A substrate is provided. The ZnO nanomaterial is deposited on the substrate to form an electron transport layer.

The ZnO nanomaterial may be deposited on the substrate by a chemical method or a physical method. The chemical method may include, but is not limited to, a chemical vapor deposition method or a continuous ion layer adsorption and reaction method. The physical method may include, but is not limited to, a physical coating method or a solution method.

In some embodiments, the ZnO nanomaterial may be formulated into a solution and the deposition of the ZnO nanomaterial can be realized using a solution processing method. The solution processing method may include, but is not limited to, spin coating, inkjet printing, etc. After the ZnO nanomaterial solution is deposited, an annealing treatment may be performed to remove the solvent in the film layer to obtain the electron transport layer.

In some embodiments, remaining film layers may be formed on the electron transport layer. In some embodiments, when the substrate includes an anode substrate, a cathode may be formed on the electron transport layer to obtain the quantum dot light-emitting diode. In some other embodiments, when the substrate is a cathode substrate, the quantum dot light-emitting layer and the anode may be formed on the electron transport layer in sequence to obtain the quantum dot light-emitting diode. In some embodiments, before the anode is formed, the hole transport layer may be formed on the surface of the quantum dot light-emitting layer away from the electron transport layer.

In embodiments of the present disclosure, the layers in the quantum dot light-emitting diode may include the hole transport layer, the quantum dot light-emitting layer, the cathode, and the anode, which may be formed by a chemical method or a physical method. The chemical method may include, but is not limited to, a chemical vapor deposition method or an anode oxidation method. The physical method may include, but is not limited to, a physical coating method or a solution method.

In some embodiments, the preparation method may further include performing packaging processing on the obtained QLED device. The packaging processing may be performed by a common machine or manually. In some embodiments, the oxygen content and the water content in the packaging processing environment may be less than 0.1 ppm to ensure the stability of the QLED device.

Examples and comparative examples are described below.

Example 1

A ZnO nanomaterial includes a ZnO nanoparticle and p-methoxybenzamide bonded to the ZnO nanoparticle.

A preparation method of the ZnO nanomaterial includes the following steps.

Zinc acetate with a proper amount is added to a 50 ml ethanol solution to prepare a zinc acetate ethanol solution of 1 mol/L. The solution is stirred and dissolved at 70° C. to obtain a first precursor solution. Potassium hydroxide is weighed according to a ratio of Zn atoms to OH-molar at 1:1.5. The potassium hydroxide is added to 50 ml of ethanol solution to prepare a 1.5 mol/L potassium hydroxide solution. The potassium hydroxide solution is stirred and dissolved to obtain a second precursor solution.

The first precursor solution is injected into the second precursor solution. An injection rate is 10 ml/min, and magnetic stirring and mixing are performed for 30 min to prepare the ZnO nanoparticle. Then, p-methoxybenzamide powder is added and heated to 50° C. for magnetic stirring until the solution is completely clarified. The surface-modified ZnO nanomaterial is obtained after cleaning.

Example 2

A ZnO nanomaterial includes a ZnO nanoparticle and p-ethoxybenzamide bonded to the ZnO nanoparticle.

A preparation method of the ZnO nanomaterial includes the following steps.

Zinc nitrate with a proper amount is added to 50 ml of the propanol solution to prepare a zinc nitrate solution of 1 mol/L. The solution is stirred and dissolved at 70° C. to obtain a first precursor solution. Sodium hydroxide is weighed according to a molar ratio of Zn atom to OH— at 1:1.3. The sodium hydroxide is added to 50 ml of propanol solution to prepare a sodium hydroxide solution of 1.3 mol/1. The sodium hydroxide solution is stirred and dissolved to obtain a second precursor solution.

The first precursor solution is injected into the second precursor solution. An injection rate is 5 ml/min. Magnetic stirring and mixing are performed for 30 min to prepare the ZnO nanoparticle. Then, p-ethoxybenzamide powder is added and heated to 50° C. for magnetic stirring until the solution is completely clarified. The surface-modified ZnO nanomaterial is obtained after cleaning.

Example 3

A ZnO nanomaterial includes a ZnO nanoparticle and m-methoxybenzamide bonded to the ZnO nanoparticle.

A preparation method of the ZnO nanomaterial includes the following steps.

Zinc chloride with a proper amount is added to 50 ml of a butanol solution to prepare a zinc chloride butanol solution of 1 mol/L. The solution is stirred and dissolved at 70° C. to obtain a first precursor solution. Potassium hydroxide is weighed according to a molar ratio of Zn atom to OH— at 1:1.1. The potassium hydroxide is added to 50 ml of the propanol solution to prepare the potassium hydroxide solution of 1.1 mol/L. The potassium hydroxide solution is stirred and dissolved to obtain a second precursor solution.

The first precursor solution is injected into the second precursor solution. An injection rate is 8 ml/min. The magnetic stirring and mixing are performed for 30 min to prepare the ZnO nanoparticle. Then, m-methoxybenzamide powder is added and heated to 50° C. for magnetic stirring until the solution is completely clarified. The surface-modified ZnO nanomaterial is obtained after cleaning.

Comparative Example 1

A preparation method of the ZnO nanomaterial includes the following steps.

The first precursor solution is injected into the second precursor solution. The injection rate is 8 ml/min. The magnetic stirring and mixing are performed for 30 min to prepare the ZnO nanoparticle. Then, the m-methoxybenzamide powder is added and heated to 50° C. for magnetic stirring until the solution is completely clarified. The surface-modified ZnO nanomaterial is obtained after cleaning.

Zinc acetate with a proper amount is added to a 50 ml ethanol solution to prepare a zinc acetate ethanol solution of 1 mol/L. The solution is stirred and dissolved at 70° C. to obtain the first precursor solution. The potassium hydroxide is weighed according to a molar ratio of Zn atom to OH— at 1:1.1. The sodium hydroxide is added to a 50 ml ethanol solution to prepare a 1.1 mol/L potassium hydroxide solution. The potassium hydroxide solution is stirred and dissolved to obtain the second precursor solution.

The first precursor solution is injected into the second precursor solution. The injection rate is 10 ml/min. The magnetic stirring and mixing are performed for 30 min to prepare the ZnO nanoparticle.

Figure 5:
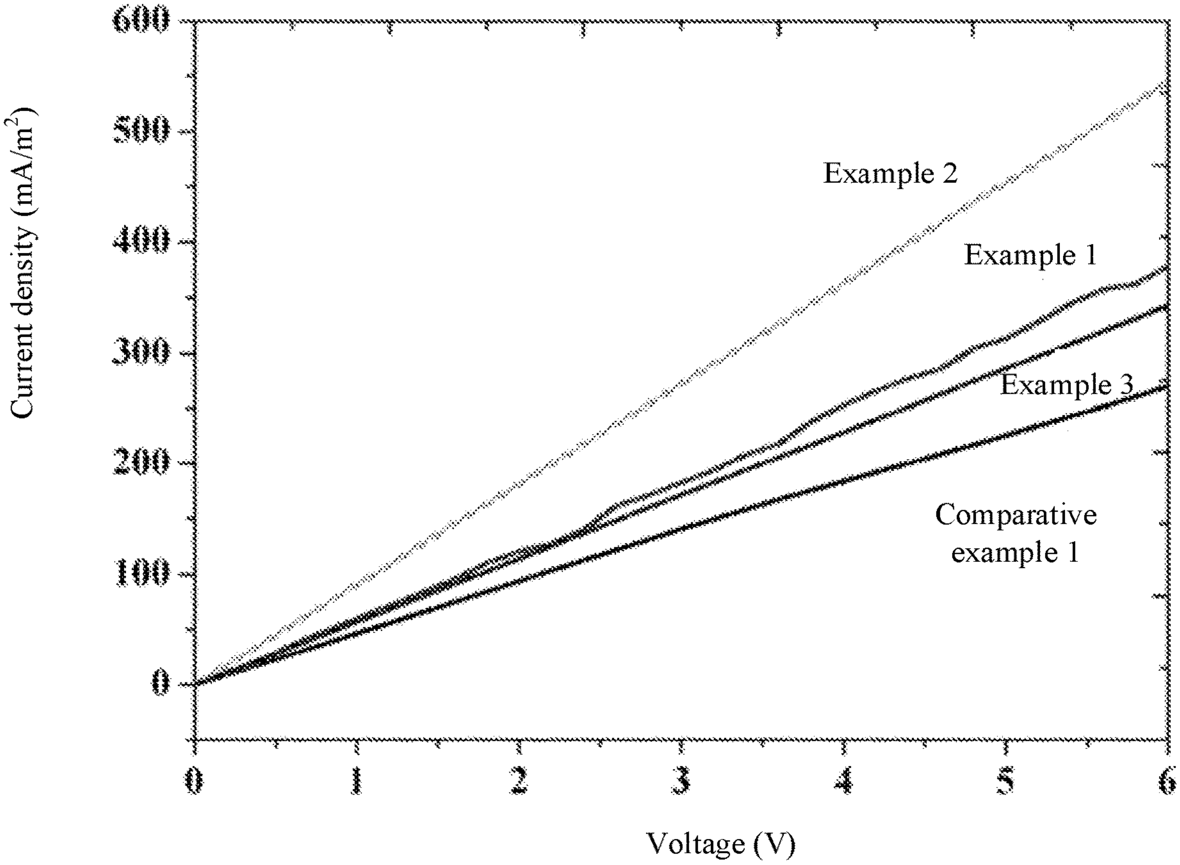
FIG. 5 is a schematic diagram showing a conductivity test result of nanomaterials of Examples 1-3 and Comparative Example 1 according to some embodiments of the present disclosure.

A conductivity test is performed on the ZnO nanomaterials prepared in Examples 1-3 and Comparative Example 1. A test method is as follows. A device with a laminated structure such as ITO/ZnO/A1 may be provided. A relationship between the current and the voltage is characterized. The conductivity is calculated using the following equation: $\sigma=(I*d)/(V*A)$. In the equation, d denotes a thickness of a film layer, and A denotes a device area. The test results are shown in FIG. 5. A relative current density of the ZnO nanomaterial modified by the alkoxyphenylamide structure of embodiments of the present disclosure is higher than a relative current density of the ZnO nanoparticle without being modified. Compared with the modified ZnO nanoparticle, the conductivity of the ZnO nanomaterial modified by the alkoxyphenylamide structure embodiments of the present disclosure may be enhanced.

The above are merely some embodiments of the present disclosure and are not intended to limit the present disclosure. For those skilled in the art, various modifications and changes may be made to the present disclosure. Any modifications, equivalent replacements, and improvements made within the spirit and principle of the present invention shall be within the scope of the claims of the present application.

What is claimed is:

1. A zinc oxide (ZnO) nanomaterial comprising:
- a ZnO nanoparticle; and
- a surface ligand bonded to the ZnO nanoparticle, the surface ligand being at least one selected from m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,4-dimethoxybenzamide, 3,4-dimethoxybenzamide, or 5-amino-4-methoxybenzamide

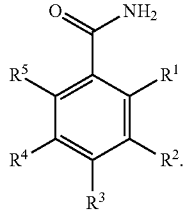

2. The ZnO nanomaterial according to claim 1, wherein the ZnO nanomaterial is composed of the ZnO nanoparticle and the surface ligand bonded to the ZnO nanoparticle.

3. The ZnO nanomaterial according to claim 1, wherein a molar ratio of the ZnO nanoparticle to the surface ligand bonded to the ZnO nanoparticle ranges from 1:5 to 1:50.

4. A preparation method of a zinc oxide (ZnO) nanomaterial comprising:
- preparing a mixed solution of a ZnO nanoparticle and a surface ligand; and
- causing the ZnO nanoparticle to react with the surface ligand in the mixed solution to prepare ZnO nanoparticle having the surface ligand bonded thereto;
- wherein:
  - the surface ligand has a structure of

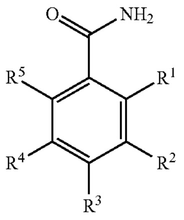

- $R^1$, $R^2$, $R^3$, $R^4$, and $R^5$ are independently selected from at least one of hydrogen, alkoxy group with a carbon number of one to three, or amino group; and
  - $R^1$, $R^2$, $R^3$, $R^4$, and $R^5$ include:
    - one to three alkoxy groups with a carbon number of one to three; and
    - zero to one amino group.

5. The method according to claim 4, wherein:
- $R^1$, $R^2$, $R^3$, $R^4$, and $R^5$ include:
  - two alkoxy groups with a carbon number of one to three; and
  - zero to one amino group; and
- at least $R^2$ or $R^3$ is selected from alkoxy group with a carbon number of one to three.

6. The method according to claim 4, wherein the surface ligand is at least one selected from p-methoxybenzamide, m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,5-dimethoxybenzamide, 3,4-dimethoxybenzamide, or 5-amino-4-methoxybenzamide.

7. The method according to claim 4, wherein the ZnO nanomaterial is composed of the ZnO nanoparticle and the surface ligand bonded to the ZnO nanoparticle.

8. The method according to claim 4, wherein in the mixed solution, a molar ratio of the ZnO nanoparticle to the surface ligand ranges from 1:5 to 1:50.

9. The method according to claim 4, wherein during preparing the mixed solution and reacting to prepare the ZnO nanoparticle having the ligand, a reaction temperature ranges from 20 to 60° C.

10. A semiconductor device comprising:
- an anode and a cathode arranged oppositely to each other;
- an active layer arranged between the anode and the cathode; and
- an electron transport layer arranged between the active layer and the cathode;
- wherein:
  - a material of the electron transport layer includes a zinc oxide (ZnO) nanomaterial;
  - the ZnO nanomaterial includes:
    - a ZnO nanoparticle; and
    - a surface ligand bonded to the ZnO nanoparticle, the surface ligand being at least one selected from m-methoxybenzamide, o-methoxybenzamide, p-ethoxybenzamide, m-ethoxybenzamide, o-ethoxybenzamide, 2,5-dimethoxybenzamide, 3,5-dimethoxybenzamide, 2,4-dimethoxybenzamide, 3,4-dimethoxybenzamide, or 5-amino-4-methoxybenzamide

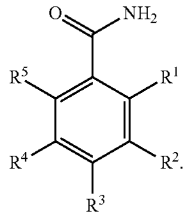

11. The semiconductor device according to claim 10, wherein the ZnO nanomaterial is composed of the ZnO nanoparticle and the surface ligand bonded to the ZnO nanoparticle.

12. The semiconductor device according to claim 10, wherein a molar ratio of the ZnO nanoparticle to the surface ligand bonded to the ZnO nanoparticle ranges from 1:5 to 1:50.

13. The semiconductor device according to claim 10, wherein the active layer is a quantum dot light-emitting layer.

14. The semiconductor device according to claim 13, wherein the quantum dot light-emitting layer is at least selected from cadmium sulfide (CdS) or cadmium selenide (CdSe).

15. The semiconductor device according to claim 10, wherein:

the anode is at least selected from a doped metal oxide; and the cathode is at least selected from a conductive carbon material, a conductive metal oxide material, or a metal material.

16. The semiconductor device according to claim 10, further comprising:

a hole functional layer including:

a hole injection layer; and a hole transport layer at least selected from poly([(9,9-dioctylfluorene-alt-dioctylfluorenyl-2,7-diyl)-co-(4,4'-(N-(4-sec-butylphenyl)-)diphenylamine))] (TFB) or polyvinylcarbazole (PVK).

* * * * *